United States Patent
Pyo

(10) Patent No.: US 8,969,194 B2
(45) Date of Patent: Mar. 3, 2015

(54) BACKSIDE ILLUMINATED IMAGE SENSOR AND MANUFACTURING METHOD THEREOF

(71) Applicant: Intellectual Ventures II LLC, Wilmington, DE (US)

(72) Inventor: Sung-Gyu Pyo, Gyeonggi-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 14/053,741

(22) Filed: Oct. 15, 2013

(65) Prior Publication Data

US 2014/0038337 A1 Feb. 6, 2014

Related U.S. Application Data

(62) Division of application No. 12/996,865, filed as application No. PCT/KR2009/003113 on Jun. 10, 2009, now Pat. No. 8,564,135.

(30) Foreign Application Priority Data

Jun. 11, 2008 (KR) .......................... 10-2008-0054876

(51) Int. Cl.
  *H01L 27/146* (2006.01)
  *H01L 23/48* (2006.01)

(52) U.S. Cl.
  CPC .......... *H01L 27/1469* (2013.01); *H01L 23/481* (2013.01); *H01L 27/14632* (2013.01); *H01L 27/14636* (2013.01); *H01L 27/1464* (2013.01); H01L 2924/0002 (2013.01)
  USPC .................. 438/639; 257/774; 257/E31.124; 438/637

(58) Field of Classification Search
  CPC .............. H01L 23/481; H01L 27/1464; H01L 27/1469; H01L 27/14632; H01L 27/14636
  USPC ........... 257/773, 774, E31.124; 438/637, 639
  See application file for complete search history.

(56) References Cited

U.S. PATENT DOCUMENTS 6,667,528 B2   12/2003   Cohen et al.
6,821,809 B2   11/2004   Abe et al.

(Continued)

FOREIGN PATENT DOCUMENTS

JP   2005150463   6/2005
JP   2006339566   12/2006

(Continued)

OTHER PUBLICATIONS

Supplemental European Search Report for EP Application No. 09762661, dated Mar. 7, 2012, 6 pages.

(Continued)

*Primary Examiner* — Allan R Wilson
(74) *Attorney, Agent, or Firm* — McAndrews, Held & Malloy, Ltd.

(57) ABSTRACT

Disclosed is a backside illuminated image sensor including a light receiving element formed in a first substrate, an interlayer insulation layer formed on the first substrate including the light receiving element, a via hole formed through the interlayer insulation layer and the first substrate while being spaced apart from the light receiving element, a spacer formed on an inner sidewall of the via hole, an alignment key to fill the via hole, interconnection layers formed on the interlayer insulation layer in a multilayer structure in which a backside of a lowermost layer of the interconnection layers is connected to the alignment key, a passivation layer covering the interconnection layers, a pad locally formed on a backside of the first substrate and connected to a backside of the alignment key, and a color filter and a microlens formed on the backside of the first substrate corresponding to the light receiving element.

19 Claims, 8 Drawing Sheets

(56) References Cited

U.S. PATENT DOCUMENTS

| | | |
|---|---|---|
| 7,101,726 B2 | 9/2006 | Yamamoto et al. |
| 7,468,289 B2 | 12/2008 | Maruyama et al. |
| 8,049,256 B2 | 11/2011 | Guidash |
| 8,212,328 B2 | 7/2012 | Pyo |
| 8,558,292 B2 * | 10/2013 | Guidash ............... 257/292 |
| 2005/0104148 A1 | 5/2005 | Yamamoto et al. |
| 2005/0139828 A1 | 6/2005 | Maruyama et al. |
| 2005/0250316 A1 | 11/2005 | Choi et al. |
| 2006/0249803 A1 | 11/2006 | Yamamoto et al. |
| 2006/0281215 A1 | 12/2006 | Maruyama et al. |
| 2007/0052050 A1 * | 3/2007 | Dierickx ............... 257/432 |
| 2007/0215971 A1 | 9/2007 | Yamamoto et al. |
| 2008/0083939 A1 * | 4/2008 | Guidash ............... 257/292 |
| 2008/0203579 A1 | 8/2008 | Cooney et al. |
| 2008/0224271 A1 * | 9/2008 | Sogawa et al. ........ 257/621 |
| 2008/0284041 A1 | 11/2008 | Jang et al. |
| 2008/0308890 A1 * | 12/2008 | Uya ...................... 257/437 |
| 2009/0011534 A1 | 1/2009 | Yamamoto et al. |
| 2009/0309232 A1 | 12/2009 | Roy |
| 2010/0096718 A1 * | 4/2010 | Hynecek et al. ...... 257/460 |
| 2011/0223707 A1 | 9/2011 | Hynecek et al. |
| 2012/0252154 A1 | 10/2012 | Pyo |
| 2013/0009270 A1 | 1/2013 | Tsai et al. |
| 2013/0037958 A1 | 2/2013 | Ho et al. |

FOREIGN PATENT DOCUMENTS

| | | |
|---|---|---|
| JP | 2007234725 | 9/2007 |
| KR | 2005-47481 | 5/2005 |
| KR | 20050042729 | 5/2005 |
| KR | 10-0533166 | 12/2005 |
| KR | 20060006340 | 1/2006 |
| KR | 2006-96924 | 9/2006 |
| KR | 2008-13566 | 2/2008 |
| WO | 2007148891 | 12/2007 |

OTHER PUBLICATIONS

International Search Report for PCT/KR2009/003113, with English translation.

* cited by examiner

BACKSIDE ILLUMINATED IMAGE SENSOR AND MANUFACTURING METHOD THEREOF

CROSS-REFERENCE TO RELATED APPLICATIONS

The present application is a divisional of U.S. application Ser. No. 12/996,865, filed Apr. 19, 2011, which is a 35 U.S.C. §371 national stage filing of PCT Application PCT/KR2009/003113, filed Jun. 10, 2009, which claims priority to KR Application 10-2008-0054876, filed Jun. 11, 2008. Each of the above-identified applications are incorporated herein by reference in their entirety.

TECHNICAL FIELD

The present invention relates to a semiconductor manufacturing technology, particularly to an image sensor and a method for manufacturing the same, and more particularly to a backside illuminated image sensor and a method for manufacturing the same.

BACKGROUND ART

In a general complementary metal oxide semiconductor (CMOS) image sensor, a peripheral circuits such as a light receiving element unit, a digital control block and an analog-to-digital converter are arranged in a limited area within a chip. Thus, an area ratio of a pixel array per a chip area is limited to about 40%. Furthermore, a pixel size is reduced for the implementation of high quality images. Therefore, the amount of light received in one light receiving element is reduced, causing various problems such as image loss resulting from an increase in noise.

DETAILED DESCRIPTION OF THE INVENTION

Technical Problem

Accordingly, the present invention has been made to solve the above-mentioned problems occurring in the prior art, and the present invention provides a backside illuminated image sensor, in which light is illuminated from the backside of a wafer, and a method for manufacturing the same.

Technical Solution

In accordance with an aspect of the present invention, there is provided a backside illuminated image sensor including a light receiving element formed in a first substrate, an interlayer insulation layer formed on the first substrate including the light receiving element, a via hole formed through the interlayer insulation layer and the first substrate while being spaced apart from the light receiving element, a spacer formed on an inner sidewall of the via hole, an alignment key to fill the via hole, interconnection layers formed on the interlayer insulation layer in a multilayer structure in which a backside of a lowermost layer of the interconnection layers is connected to the alignment key, a passivation layer covering the interconnection layers, a pad locally formed on a backside of the first substrate and connected to a backside of the alignment key, and a color filter and a microlens formed on the backside of the first substrate to correspond the light receiving element.

In accordance with another aspect of the present invention, there is provided a method for manufacturing a backside illuminated image sensor comprising the steps of forming a light receiving element in a first substrate, forming an interlayer insulation layer on the first substrate including the light receiving element, forming a via hole by partially etching the interlayer insulation layer and the first substrate, forming a spacer on an inner sidewall of the via hole, forming an alignment key to fill the via hole, forming interconnection layers with a multilayer structure on the first substrate including the alignment key, forming a passivation layer to cover the interconnection layers, bonding a second substrate to the passivation layer, exposing a backside of the alignment key to a backside of the first substrate, locally forming a pad on the backside of the first substrate so that the pad is connected to the backside of the alignment key, and forming a color filter and a microlens on the backside of the first substrate in correspondence with the light receiving element.

Advantageous Effects

According to the present invention as described above, the following effects can be achieved.

First, the backside illuminated image sensor can receive light from the backside of a wafer (substrate), so that the loss of light into the light receiving element can be minimized, thereby improving light receiving efficiency, as compared with a conventional CMOS image sensor (a front-side illuminated image sensor).

Second, according to the method for manufacturing the backside illuminated image sensor using the back grinding process of the present invention, the alignment key having a via hole shape is formed in the substrate before the back grinding process for the backside of the substrate, and the backside grinding target of the substrate is controlled using the alignment key during the back grinding process, so that the back grinding process can be easily controlled.

Third, the front side of the alignment key is connected to the interconnection layer formed on the front side of the substrate, and the backside of the alignment key is exposed to the backside of the substrate and connected to the pad. Thus, the alignment key is used as a contact plug connecting the pad to the interconnection layer, so that the pad can be arranged on the backside of the substrate, other than the front side of the substrate. Consequently, various designs are possible in the packaging process.

Fourth, according to the present invention, the spacer is formed on the inner sidewall of the via hole, thereby preventing a leakage current from flowing from the conductive alignment key connecting the pad to the interconnection layer to the first substrate.

Fifth, according to the present invention, the spacer having high etching selectivity relative to the first substrate is formed on the inner sidewall of the via hole, so that a process margin can be ensured during a subsequent process of etching the backside of the first substrate and the alignment key can be prevented from being damaged by etchant during the etching process.

Last, according to the present invention, the anti-light scattering layer is formed in the backside illuminated image sensor, which receives light from the backside of a wafer (substrate), to prevent scattering of the light incident into the backside of the substrate, so that light can be effectively collected on the photodiode, thereby improving the light receiving efficiency.

DESCRIPTION OF DRAWINGS

The above and other objects, features and advantages of the present invention will be more apparent from the following detailed description taken in conjunction with the accompanying drawings, in which.

MODE FOR INVENTION

Figure 1:
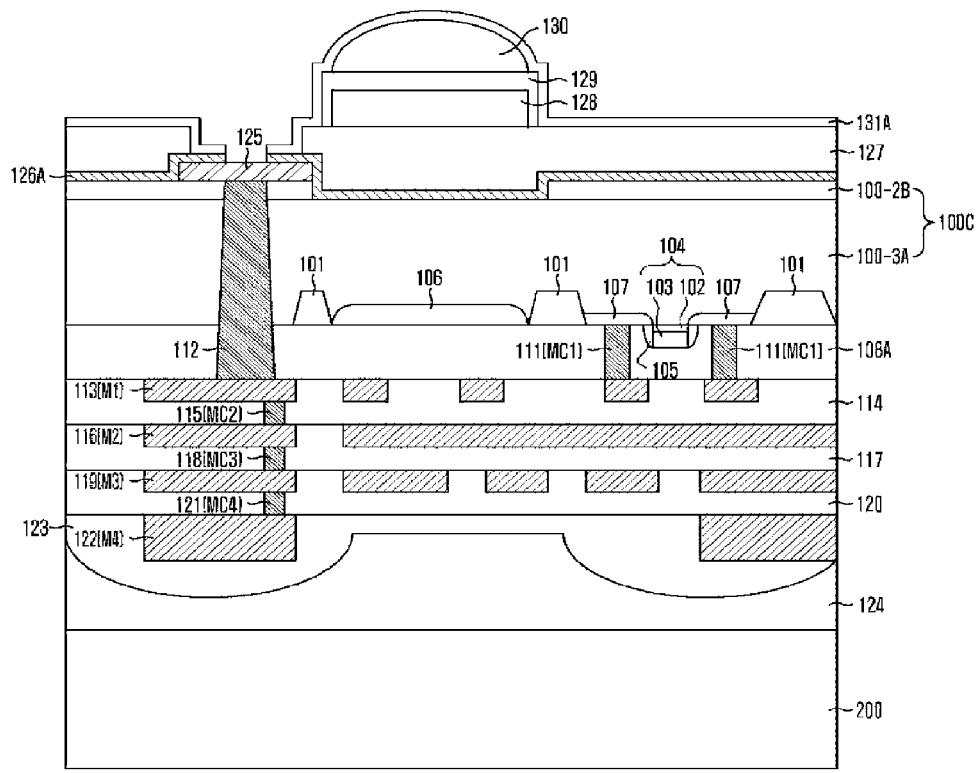
FIG. 1 is a sectional view illustrating a backside illuminated image sensor according to an embodiment of the present invention.

Hereinafter, exemplary embodiments of the present invention will be described with reference to the accompanying drawings. In the drawings, the thickness and space of layers and regions may be exaggerated to facilitate explanation. When a first layer is referred to as being 'on' or 'above' a second layer or a substrate, it could mean that the first layer is formed directly on the second layer or the substrate, or it could also mean that a third layer may intervene between the first layer and the substrate. Furthermore, the same reference numerals designate the same layers throughout the drawings. In addition, English characters of the reference numerals refer to partial modification of the same layers by an etching process or a polishing process. Moreover, a first conductive type and a second conductive type refer to different conductive types, for example, p-type and n-type.

FIG. 1 is a sectional view illustrating a backside illuminated image sensor according to an embodiment of the present invention. For the purpose of convenience, FIG. 1 illustrates only a photodiode and a gate electrode of a driving transistor in a unit pixel of a CMOS image sensor.

Referring to FIG. 1, the backside illuminated image sensor according to the embodiment of the present invention has a structure in which a device wafer and a handle wafer 200 are bonded to each other. The device wafer includes a light receiving element such as a photodiode, and the handle wafer includes with peripheral circuits such as digital blocks and an analog-to-digital converter. In the following description, the device wafer and the handle wafer will be referred to as a first substrate and a second substrate, respectively.

In detail, the backside illuminated image sensor according to the embodiment of the present invention includes a light receiving element 106 (e.g., a photodiode) formed in a first substrate 100C, an interlayer insulation layer 108A formed on the first substrate 100C including the light receiving element 106, a via hole (110, see FIG. 3) formed through the interlayer insulation layer 108A and the first substrate 100C while being spaced apart from the light receiving element 106, a spacer 140 formed on the inner sidewall of the via hole 110, an alignment key 112 to fill the via hole 110, interconnection layers 113, 116, 119 and 122 formed on the interlayer insulation layer 108A in a multilayer structure, where the backside of the interconnection layer 113 is connected to the alignment key 112, a passivation layer 124 covering the interconnection layers 113, 116, 119 and 122, a pad 125 locally formed on the backside of the first substrate 100C and connected to the backside of the alignment key 112, and a color filter 128 and a microlens 130 formed on the backside of the first substrate 100C corresponding to the light receiving element 106.

The first substrate 100C and the second substrate 200 may include one of a bulk substrate, an epitaxial substrate and a silicon on insulator (SOI) substrate. Considering the device characteristics, the first substrate 100C may include an SOI substrate where a semiconductor layer, a buried oxide layer and a semiconductor layer are stacked, and the second substrate 200 may include a bulk substrate, which is relatively inexpensive.

The spacer 140 blocks a leakage current flowing from the alignment key 112 to the first substrate 100C. Furthermore, the spacer 140 ensures an etching margin during a backside etching process, which is performed with respect to the first substrate 100C after a back grinding process of the first substrate 100C, and prevents the alignment key 112 from being damaged by etchant used in the etching process. The spacer 140 may include a nitride layer having high etching selectivity relative to the first substrate 100C (i.e., a silicon substrate) as compared with an oxide layer.

A plurality of alignment keys 112 are provided. The alignment keys 112 are connected to one pad 125. The front side of the alignment key 112 is connected to the interconnection layer 113 among the interconnection layers 113, 116, 119 and 122 to transfer a signal (a voltage) applied from the pad 125 to the interconnection layers 113, 116, 119 and 122. The alignment key 112 may be formed using a conductive material, for example, a metal or an alloy. In addition, the alignment key 112 may be formed in a circular shape, an oval shape or a polygonal (a triangular, a rectangular, a pentagonal and the like) shape. There is no limitation in the number and size (width) of the alignment keys 112.

Furthermore, the backside illuminated image sensor according to the embodiment of the present invention may further include a barrier layer 141 formed on the inner surface of the via hole 110 to surround an outer wall of the alignment key 112. The barrier layer 141 may include one selected from the group consisting of Ti, TiN, Ta, TaN, AlSiTiN, NiTi, TiBN, ZrBN, TiAlN, $TiB_2$, Ti/TiN and Ta/TaN.

In addition, the backside illuminated image sensor according to the embodiment of the present invention may further include an adhesive layer (not shown) formed on the inner surface of the via hole 110 between the barrier layer 141 and the spacer 140. The adhesive layer improves adhesive force between the barrier layer 141 and the spacer 140 and may include an oxide layer when the spacer 140 includes a nitride layer.

Moreover, the backside illuminated image sensor according to the embodiment of the present invention may further include an anti-light scattering layer 126A formed on the backside of the first substrate 100C including the pad 125. The anti-light scattering layer 126A may be prepared as a multilayer structure using materials having different refractive indexes. For example, the anti-light scattering layer 126A may include a stack layer of an oxide layer and a nitride layer, such as an oxide/nitride layer or a nitride/oxide layer, or a stack layer of an oxide layer and a carbon-containing layer (SiC), such as an oxide/SiC layer or a SiC/oxide layer. In such a case, the oxide layer may include one selected from the group consisting of borophosphosilicate glass (BPSG), phosilicate glass (PSG), borosilicate glass (BSG), undoped silicate glass (USG), tetra ethyle ortho silicate (TEOS) and high density plasma (HDP). The nitride layer may include a silicon nitride ($Si_xN_y$) layer, where x and y are natural numbers, or a silicon oxynitride ($Si_xO_yN_z$) layer where x and y are natural numbers. Furthermore, the nitride layer may include an N—H rich nitride layer having N—H bonds more than that of $Si_3N_4$ which is bonded in a relatively stable state in a silicon nitride layer. In addition, the nitride layer or the SiC is formed with a thin thickness. The oxide layer may have a thickness of approximately 1,000 Å to approximately 10,000 Å, and the nitride layer or the SiC may have a thickness of approximately 100 Å to approximately 5,000 Å.

Moreover, the backside illuminated image sensor according to the embodiment of the present invention further includes a plurality of transistors for transmitting and processing (amplifying) optical signals collected in the photodiode 106. For example, among transistors, a driving transistor includes a gate electrode 104 formed between the first substrate 100C and the interlayer insulation layer 108A, and source and drain regions 107 formed in the first substrate 100C exposed on both sides of the gate electrode 104.

A method for manufacturing the backside illuminated image sensor according to the embodiment of the present invention will be described below.

FIGS. 2 to 12 are sectional views illustrating the procedure for manufacturing the backside illuminated image sensor according to the embodiment of the present invention. In the following description, an SOI substrate will be explained as an example.

Figure 2:
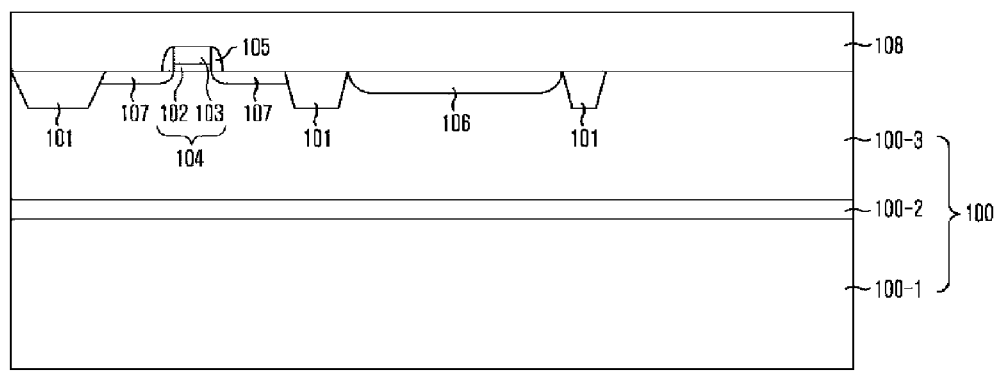
FIGS. 2 to 12 are sectional views illustrating the procedure for manufacturing a backside illuminated image sensor according to an embodiment of the present invention.

Referring to FIG. 2, a first substrate 100, for example, an SOI substrate, is prepared. The SOI substrate includes a first semiconductor layer 100-1, a buried oxide layer 100-2 and a second semiconductor layer 100-3. The second semiconductor layer 100-3 may be doped with a first conductive type or a second conductive type. For example, the second semiconductor layer 100-3 is doped with the first conductive type. In addition, the buried oxide layer 100-2 may have a thickness of approximately 500 Å to approximately 10,000 Å and the second semiconductor layer 100-3 may have a thickness of approximately 1 µm to approximately 10 µm.

An isolation layer 101 is locally formed in the first substrate 100. The isolation layer 101 may be formed through a shallow trench isolation (STI) process or a local oxidation of silicon (LOCOS) process. However, it is preferred that the isolation layer 101 is formed through the STI process suitable for high integration as illustrated in FIG. 2a. If the STI process is applied, the isolation layer 101 may be prepared as a high density plasma (HDP) layer, which has superior gap fill characteristics even in a high aspect ratio, or a stack layer of an HDP layer and a spin on dielectric (SOD) layer.

A gate insulation layer 102 and a gate conductive layer 103 are formed on the first substrate 100 and etched to form the gate electrode 104 of the driving transistor. Although not shown, gate electrodes of a transfer transistor, a reset transistor and a select transistor, which constitute a unit pixel of the CMOS image sensor, may also be formed.

A spacer 105 may be formed on both sidewalls of the gate electrode 104. The spacer 105 may include an oxide layer, a nitride layer or a stack layer thereof.

Before forming the spacer 105, a lightly doped drain (LDD) region (not shown) doped with the second conductive type may also be formed in the first substrate 100 beside both sides of the gate electrode 104.

An ion implantation process is performed with respect to the first substrate 100 to form a photodiode 106 (light receiving element). The photodiode 106 is doped with the second conductive type at a low concentration.

Source and drain regions 107 doped with the second conductive type at a high concentration are formed in the first substrate 100 beside both sides of the spacer 105. The source and drain regions 107 have doping concentration higher than that of the LDD region and the photodiode 106.

In order to prevent surface noise of the photodiode 106, a doping region (not shown) doped with the first conductive type may be further formed to cover the upper surface of the photodiode 106.

Although it has been described that the gate electrode 104, the spacer 105, the photodiode 106, and the source and drain regions 107 are sequentially formed, the formation order may be appropriately changed according to the manufacturing processes.

An interlayer insulation layer 108 is formed to cover the first substrate 100 including the gate electrode 104, the spacer 105, the photodiode 106, and the source and drain regions 107. The interlayer insulation layer 108 may include an oxide layer, for example, a silicon-containing layer ($SiO_2$). More specifically, the interlayer insulation layer 108 may include one selected from the group consisting of BPSG, PSG, BSG, USG, TEOS and HDP, or a stack layer thereof. In addition, the interlayer insulation layer 108 may include a layer such as an SOD layer which is deposited by a spin coating process.

Figure 3:
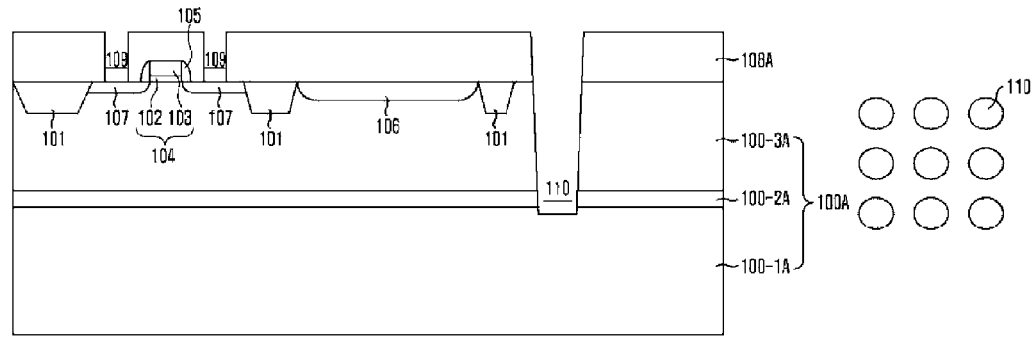

Referring to FIG. 3, an etching process is performed to locally etch the interlayer insulation layer 108 to form a contact hole 109 through which the source and drain regions 107 are exposed. The etching process may be performed through a dry etching process or a wet etching process. The dry etching process is preferred because the interlayer insulation layer 108 can be formed with a vertically etched surface.

The interlayer insulation layer 108 and the first substrate 100 are locally etched. Hereinafter, the etched interlayer insulation layer 108 and the etched first substrate 100 are called an interlayer insulation layer 108A and a first substrate 100A, respectively. Thus, a via hole 110 extending from the interlayer insulation layer 108A to a first semiconductor layer 100-1A is formed. Many via holes 110 may be provided in a matrix configuration.

More specifically, the via hole 110 has a vertical angle of approximately 88° to approximately 90° and a depth of approximately 20,000 Å or less from the upper surface of the interlayer insulation layer 108A, preferably approximately 4,000 Å to approximately 20,000 Å. More preferably, the via hole 110 has a depth of approximately 1,000 Å to approximately 10,000 Å from the upper surface of a semiconductor layer 100-3A. In addition, the via hole 110 has a critical dimension (CD) of approximately 2.0 µm or less, preferably approximately 1.0 µm to approximately 2.0 µm. Moreover, the via hole 110 has a bottom width of approximately 1.6 µm or less, preferably approximately 1.0 µm to approximately 1.6 µm. When many via holes 110 are provided, it is preferable that the deviation in their angles, depths and widths is equal to or less than 4%. Furthermore, there is no limitation in the number and shape of the via holes 110. Particularly, the via hole 110 may be formed in various shapes, for example, a circular shape or polygonal (triangular, rectangular, pentagonal, octagonal and the like) shape.

Meanwhile, there is no limitation in the formation order of the contact hole 109 and the via hole 110. The contact hole 109 may be formed after forming the via hole 110. In addition, the contact hole 109 and the via hole 110 may be formed in-situ using the same plasma etching apparatus.

For example, the via hole 110 is formed using a dry etching process in two steps.

The first step is to etch the interlayer insulation layer 108A. The etching process is performed under the conditions that etching selectivity of the interlayer insulation layer 108A relative to a photoresist pattern (not shown) is 5:1 to 2:1, preferably, 2.4:1. In addition, an etch rate is in the range of approximately 7,000 Å/min to approximately 8,000 Å/min, preferably approximately 7,200 Å/min. For example, the etching process is performed under the conditions of a pressure in the range of approximately 100 mTorr to approximately 200 mTorr, and a source power in the range of approximately 100 W to approximately 2,000 W. A carbon fluoride compound, for example, $CHF_3$ or $CF_4$, is used as a source gas, and argon (Ar) may be added to the source gas to increase an etching speed and anisotropy. A flow rate of $CHF_3$ is in the range of approximately 5 sccm to approximately 200 sccm, a flow rate of $CF_4$ is in the range of approximately 20 sccm to approximately 200 sccm, and a flow rate of Ar is in the range of approximately 100 sccm to approximately 2,000 sccm.

The second step is to etch the first substrate 100A. In the second step, an etch rate is in the range of approximately 1,000 Å/min to approximately 3,000 Å/min, preferably, approximately 2,000 Å/min. The etching process can be performed under the conditions of a pressure in the range of approximately 15 mTorr to approximately 30 mTorr, a source power (RF power) in the range of approximately 400 W to approximately 600 W, and a bias power for improving the straightness of ion in the range of approximately 80 W to approximately 120 W. $SF_6$ and $O_2$ are used as a source gas. A flow rate of $SF_6$ is in the range of approximately 5 sccm to approximately 200 sccm and a flow rate of $O_2$ is in the range of approximately 1 sccm to approximately 100 sccm.

In the second step, the etching process may be performed to etch a part of the buried oxide layer 100-2, or to etch the buried oxide layer 100-2A and a part of the first semiconductor layer 100-1. In the former case, the buried oxide layer 100-2 may be over-etched by approximately 100 Å to approximately 4,000 Å. Hereinafter, the etched buried oxide layer 100-2 and the etched first semiconductor layer 100-1 are called a buried oxide layer 100-2A and the first semiconductor layer 100-1A, respectively.

Figure 4:
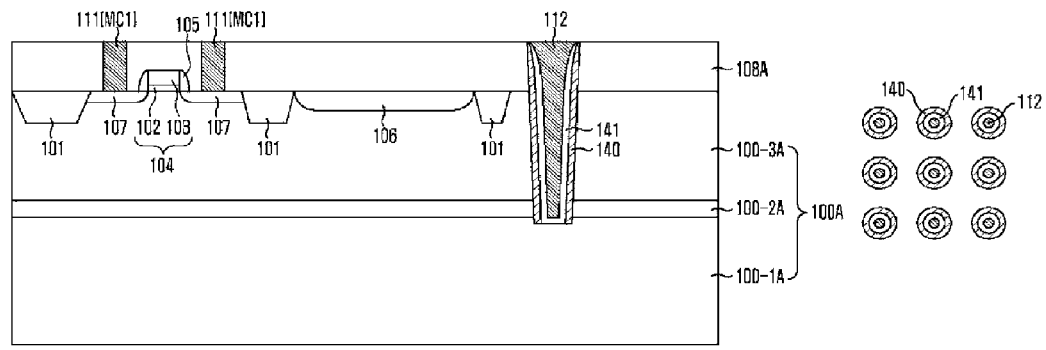

Referring to FIG. 4, a spacer 140 is formed on the inner sidewall of the via hole (110, see FIG. 3). The spacer 140 is selectively formed only on the inner sidewall of the via hole 110 by depositing a nitride layer on the interlayer insulation layer 108A along the inner surface of the via hole 110 and performing an etch-back process. At this time, preferably, the spacer 140 is not formed in the contact hole (109, see FIG. 3). To this end, the via hole 110 is formed before forming the contact hole 109, and then the spacer 140. Alternatively, after forming the contact hole 109, a photoresist pattern is formed to cover the contact hole 109, and then the spacer 140 is formed.

Barrier layers 141 may be formed on the inner surfaces of the contact hole 109 and the via hole 110. The barrier layer may include one selected from the group consisting of Ti, TiN, Ta, TaN, AlSiTiN, NiTi, TiBN, ZrBN, TiAlN, $TiB_2$ and stack layers thereof. For example, the barrier layer may include one of Ti/TiN and Ta/TaN. In order to minimize the reduction in the width of the contact hole 109 and the via hole 110, the barrier layer 141 is formed at a thickness of approximately 100 Å or less, preferably approximately 50 Å to approximately 100 Å using an atomic layer deposition (ALD) process having an excellent step coverage. In addition, the barrier layer 141 may be formed using a metal organic chemical vapor deposition (MOCVD) process or a physical vapor deposition (PVD) process.

Meanwhile, before forming the barrier layer 141, an adhesive layer (not shown) may be formed on the spacer 140 along the inner surface of the via hole 110. The adhesive layer includes an oxide layer.

Conductive materials are filled in the contact hole 109 and the via hole 110 to form a contact plug 111 and an alignment key 112. The conductive material may include one selected from the group consisting of copper (Cu), platinum (Pt), tungsten (W), aluminum (Al) and an alloy thereof. However, the conductive material is not limited thereto, but includes any metal or metal alloy having conductivity. For example, when tungsten (W) is used as the conductive material, a chemical vapor deposition (CVD) process or an ALD process is used. When aluminum (Al) is used as the conductive material, a CVD process is used. When copper (Cu) is used as the conductive material, an electroplating process or a CVD process is used.

Meanwhile, the contact plug 111 and the alignment key 112 may be simultaneously formed as described above. Also, the alignment key 112 may be formed after forming the contact plug 111, and vice versa. When the contact plug 111 and the alignment key 112 are not simultaneously formed, they may be formed of materials different from each other. For example, the contact plug 111 is formed of impurity-doped polysilicon and the alignment key 112 is formed of the above-described conductive material.

A method for forming the contact plug 111 and the alignment key 112 will be described below. The impurity-doped polysilicon or the above-described conductive material is deposited to fill the contact hole 109, and an etch-back process or a chemical mechanical polishing (CMP) process is performed to form the contact plug 111 to fill the contact hole 109. A conductive material is deposited to fill the via hole 110, and an etch-back process or a CMP process is performed to form the alignment key 112 to fill the via hole 110.

Figure 5:
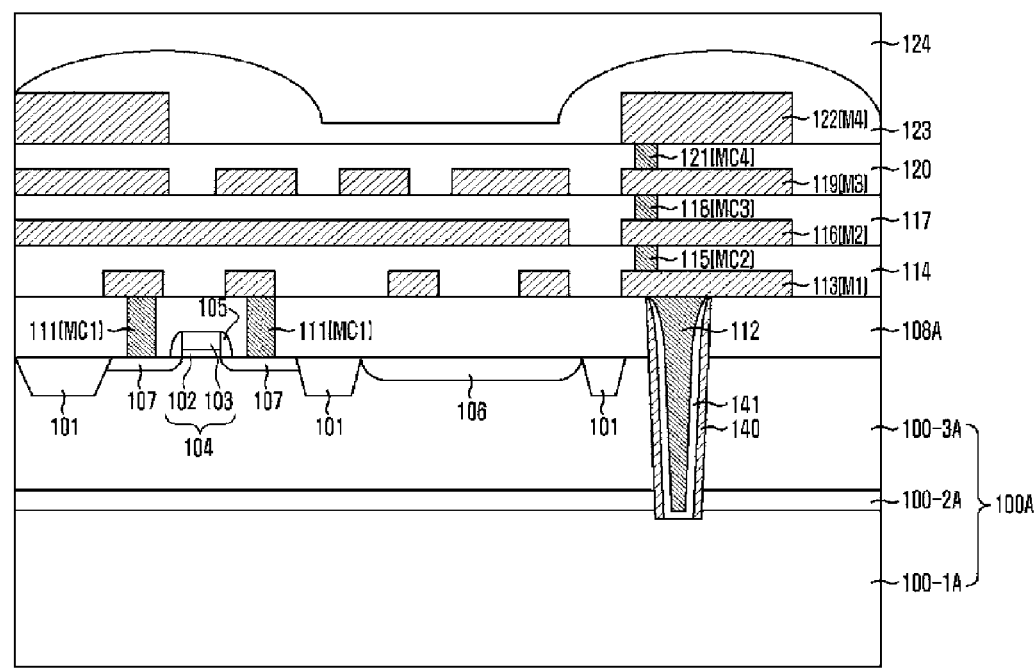

Referring to FIG. 5, a plurality of interconnection layers 113, 116, 119 and 122, a plurality of contact plugs 115, 118 and 121, and a plurality of interlayer insulation layers 114, 117, 120 and 123 are formed. For example, among the plurality of interconnection layers 113, 116, 119 and 122, a part of the interconnection layer 113 is electrically separated and connected to the contact plug 111 and another part of the interconnection layer 113 is connected to the alignment key 112.

The interconnection layers 113, 116, 119 and 122 are formed using a deposition process and an etching process. The interconnection layers 113, 116, 119 and 122 are formed of a conductive material, for example, a metal or an alloy containing at least two metals. Preferably, the interconnection layers 113, 116, 119 and 122 are formed of aluminum (Al). The contact plugs 115, 118 and 121 are formed in the interlayer insulation layers 114, 117, 120 and 123 through a damascene process. In order to electrically connect the interconnection layers 113, 116, 119 and 122 vertically stacked, the contact plugs 115, 118 and 121 are formed of a conductive material, for example, impurity-doped polysilicon, metal or an alloy containing at least two metals. Preferably, the contact plugs 115, 118 and 121 are formed of tungsten (w). The interlayer insulation layers 114, 117, 120 and 123 may include one selected from the group consisting of BPSG, PSG, BSG, USG, TEOS and HDP, or a stack layer with at least two layers thereof. In addition, interlayer insulation layers 114, 117, 120 and 123 may be planarized using a CMP process.

There is no limitation in the layer number and structure of the interconnection layers 113, 116, 119 and 122 and the contact plugs 115, 118 and 121. The number and structure of the interconnection layers and the contact plugs may be changed in various ways according to the device design.

A passivation layer 124 is formed on the interlayer insulation layer 123. The passivation layer 124 may include one selected from the group consisting of BPSG, PSG, BSG, USG, TEOS and HDP. Preferably, the passivation layer 124 is formed using TEOS or HDP to a thickness of approximately 1,000 Å to approximately 40,000 Å. Furthermore, the passivation layer 124 may include a nitride layer or a stack layer of an oxide layer and a nitride layer.

The passivation layer 124 is subject to a planarization process. The planarization process may be performed using a CMP process.

A heat treatment process may be performed to densify the passivation layer 124. The heat treatment process may be performed using an annealing process using a furnace.

Figure 6:
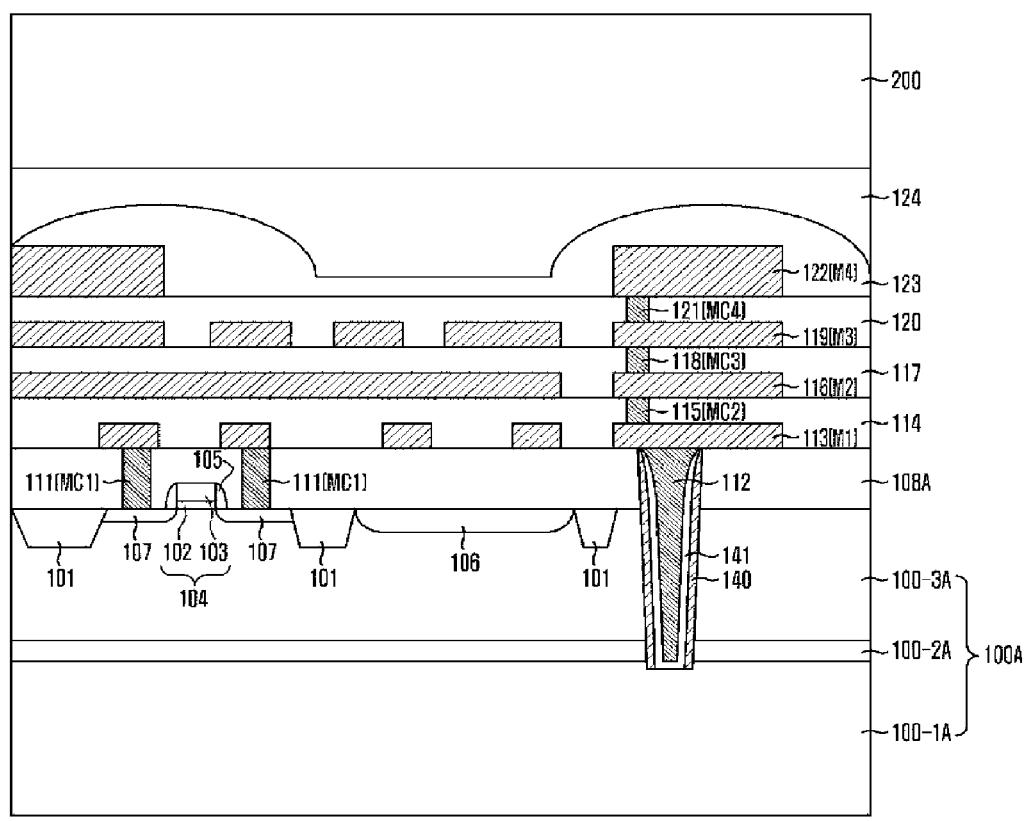

Referring to FIG. 6, the first substrate 100A manufactured through the processes of FIGS. 2 to 5 is bonded to a second substrate 200. The bonding process is performed using oxide/oxide bonding, oxide/silicon bonding, oxide/metal bonding, oxide/adhesive/oxide bonding, or oxide/adhesive/silicon bonding.

For example, the oxide/oxide (formed on the second substrate 200) bonding and the oxide/silicon (silicon substrate) bonding are to bond the two substrates after plasma treatment using $O_2$ or $N_2$ and water treatment. In addition to the method for bonding two substrates after the water treatment, the two substrates can be bonded to each other after chemical treatment using amine. In the oxide/metal (formed on the second substrate 200) bonding, the metal layer may be formed of a metal such as titanium (Ti), aluminum (Al), copper (Cu) and the like. In the oxide/adhesive/oxide bonding and the oxide/adhesive/silicon bonding, the adhesive member may use benzo cyclo butane (BCB).

Figure 7:
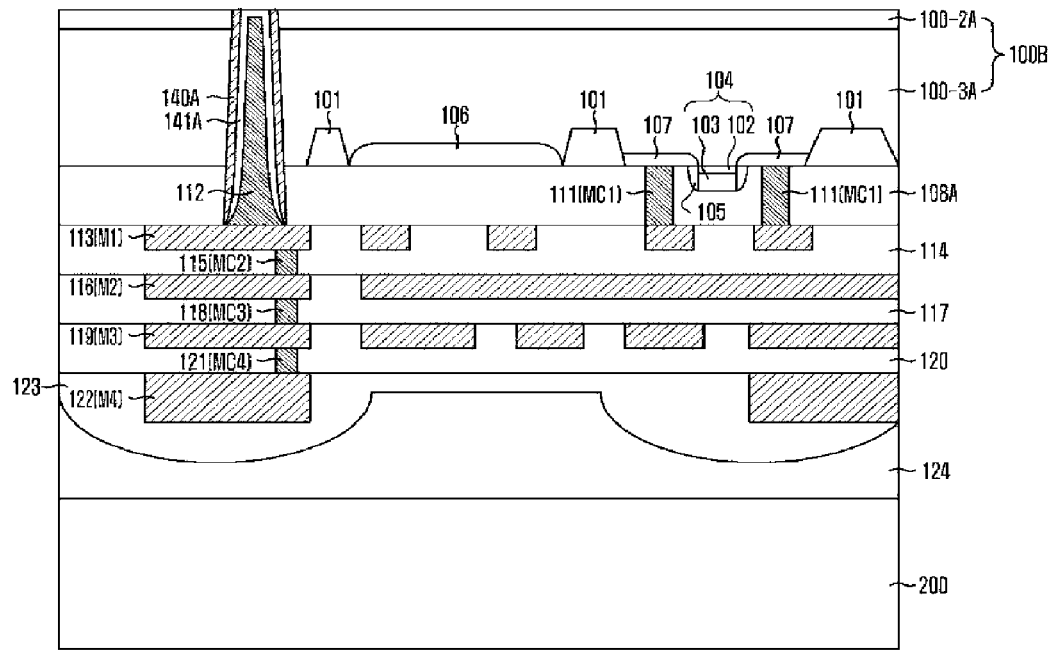

Referring to FIG. 7, a back grinding process is performed to grind the backside of the first substrate (100A in FIG. 2e). In the case where the alignment key 112 is formed through the buried oxide layer 100-2A, the alignment key 112 is exposed by performing the back grinding process until the buried oxide layer 100-2A. During the process, the buried oxide layer 100-2A may be removed by a predetermined thickness. Meanwhile, in the case where the alignment key 112 is not formed through the buried oxide layer 100-2A, that is, the alignment key 112 extends into the buried oxide layer 100-2A by a predetermined depth, the buried oxide layer 100-2A may be removed as a whole or in part to expose the alignment key 112. Alternatively, the buried oxide layer 100-2A may also be etched by a separate etching process.

An etching process is performed to remove the semiconductor layer 100-1A remaining on the buried oxide layer 100-2A after the back grinding process. The etching process may be performed using a dry etching process or a wet etching process. Preferably, the etching process is performed using the wet etching process. When the wet etching process is used, the spacer 140 is used as an etch barrier layer. To this end, the wet etching process is performed under the conditions that etching selectivity between the spacer 140 and the semiconductor layer 100-1A is high.

Figure 8:
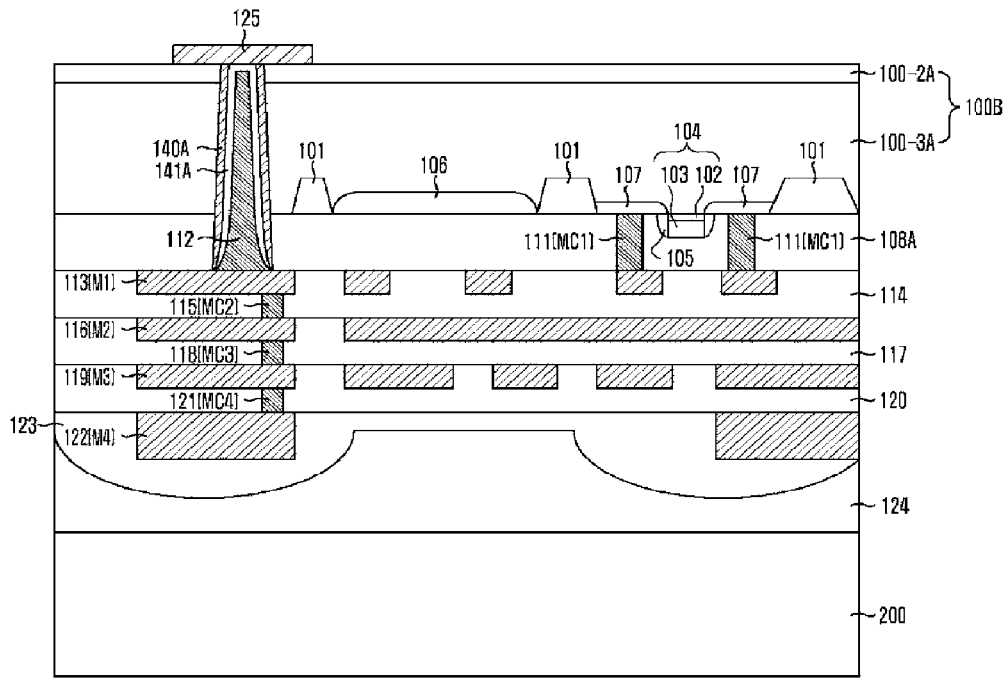

Referring to FIG. 8, a plurality of pads 125 electrically connected to the backside of the alignment key 112 are formed on the backside of the buried oxide layer 100-2A. The pads 125 may be formed of a conductive material, for example, a metal or an alloy containing at least two metals. Preferably, the pads 125 are formed of aluminum (Al). In addition, the respective pads 125 may be formed to be connected to the alignment keys 112 arranged in a matrix configuration.

Figure 9:
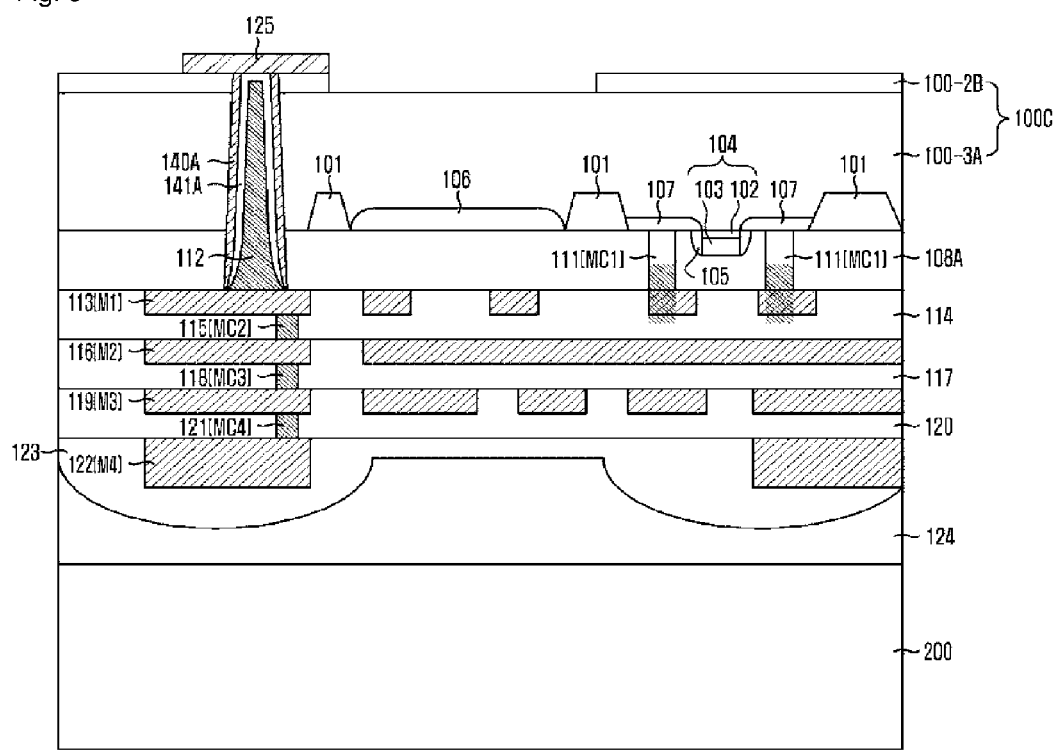

Referring to FIG. 9, a part of the buried oxide layer 100-2A overlapping the photodiode 106 is etched and removed. That is, the buried oxide layer 100-2A is locally removed such that the buried oxide layer 100-2A does not exist in a region overlapping the photodiode 106. Hereinafter, the etched buried oxide layer 100-2A is called a buried oxide layer 100-2B. Thus, a part of the semiconductor layer 100-3A corresponding to the overlapping region is exposed.

Figure 10:
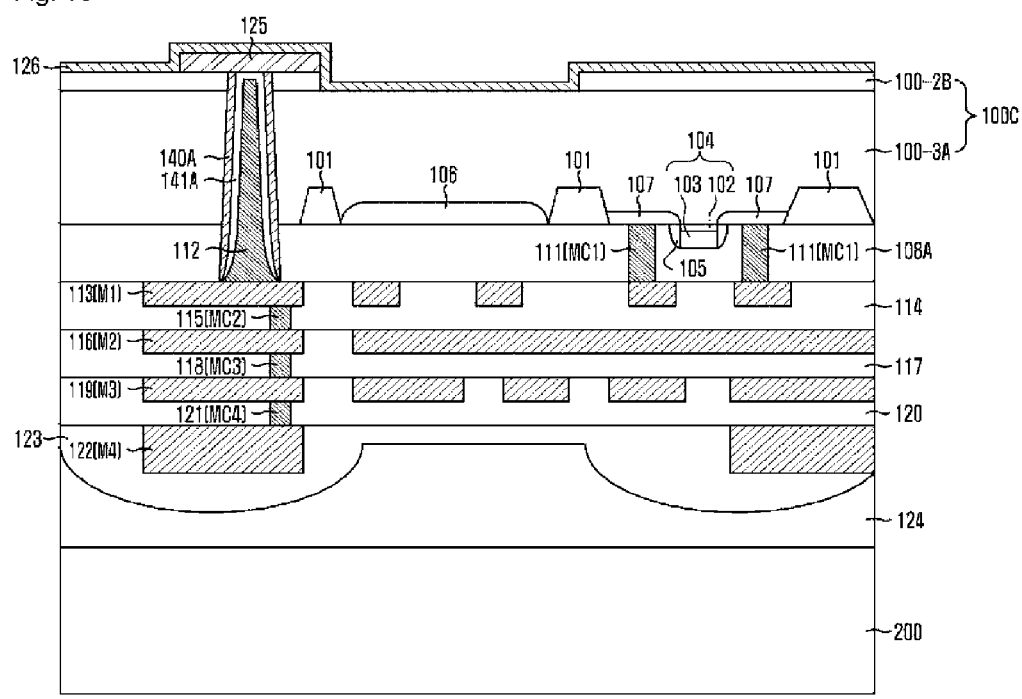

Referring to FIG. 10, an anti-light scattering layer 126 is formed on the pad 125, the semiconductor layer 100-3A and the buried oxide layer 100-2B. The anti-light scattering layer 126 may have a multilayer structure in which materials having different refractive indices are stacked. For example, the anti-light scattering layer 126 may include a stack layer of an oxide layer and a nitride layer such as an oxide/nitride layer or a nitride/oxide layer), or a stack layer of an oxide layer and a carbon-containing layer (SiC) such as an oxide/SiC layer or an SiC/oxide layer.

The oxide layer may include one selected from the group consisting of TEOS, USG, HDP, BSG, PSG and BPSG. The nitride layer may include a silicon nitride ($Si_xN_y$) layer, where x and y are natural numbers, or a silicon oxynitride ($Si_xO_yN_z$) layer where x and y are natural numbers. Furthermore, the nitride layer may include an N—H rich nitride layer having more N—H bonds than $Si_3N_4$ which is bonded in a relatively stable state in a silicon nitride layer. In the forming of the N—H rich nitride layer, a flow ratio ($SiH_4$:$NH_3$) of silane gas ($SiH_4$) to ammonia gas ($NH_3$) is in the range of approximately 1:1 to approximately 1:20, preferably, approximately 1:10.

In addition, the nitride layer or the SiC is formed thinly. The oxide layer may have a thickness of approximately 1,000 Å to approximately 10,000 Å, and the nitride layer or the SiC may have a thickness of approximately 100 Å to approximately 5,000 Å.

Meanwhile, the deposition process of the anti-light scattering layer 126 having the multilayer structure may be performed in-situ in the same chamber in order to increase the stability and reduce the processing time of the manufacturing process. If the in-situ process is not available, the deposition process may be performed ex-situ in different chambers.

Figure 11:
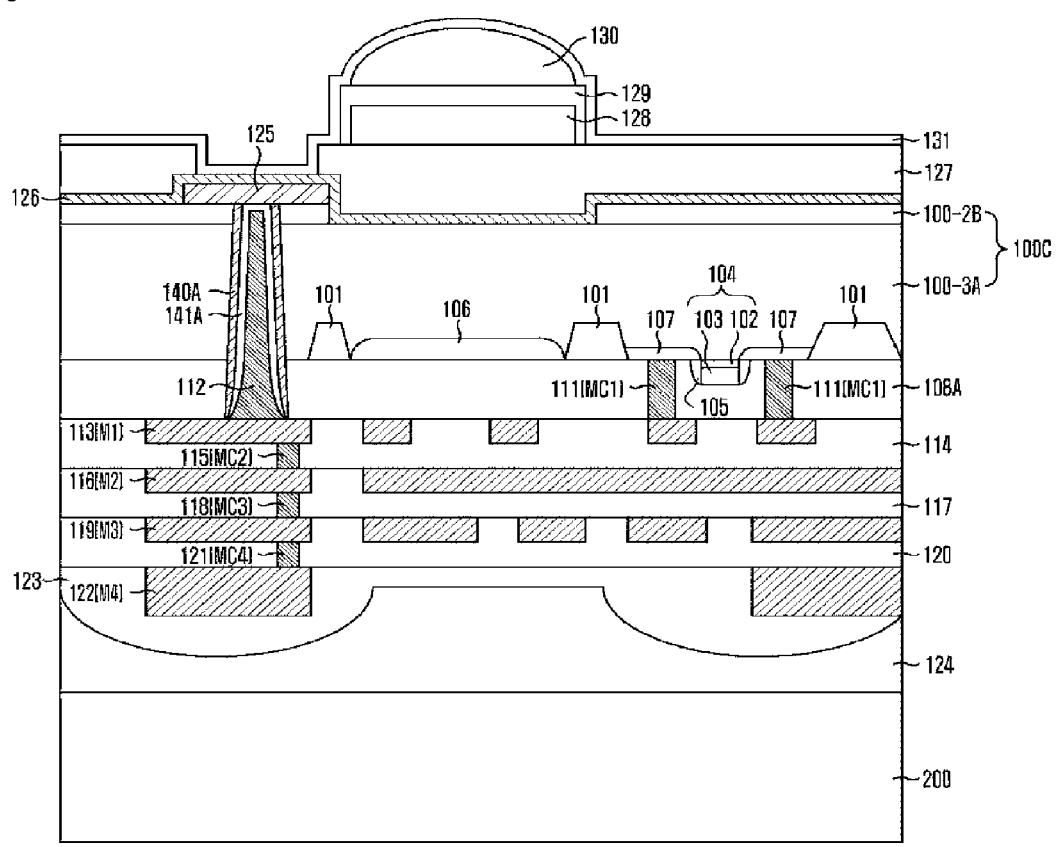

Referring to FIG. 11, a passivation layer 127 may be formed on the anti-light scattering layer 126. The passivation layer 127 may include an insulating material, for example, oxide.

The passivation layer 127 may be locally etched to expose a part of the anti-light scattering layer 126 on the pad 125.

A color filter 128 and a microlens 130 are sequentially formed on the passivation layer 127 overlapping the photodiode 106. A planarization layer 129 may be formed as an over-coating layer (OCL) between the passivation layer 127 and the color filter 128 and between the color filter 128 and the microlens 130. The planarization layer 129 may be formed of an organic material.

A low temperature oxide (LTO) layer 131 may be formed on the microlens 130, the anti-light scattering layer 126 and the passivation layer 127.

Figure 12:
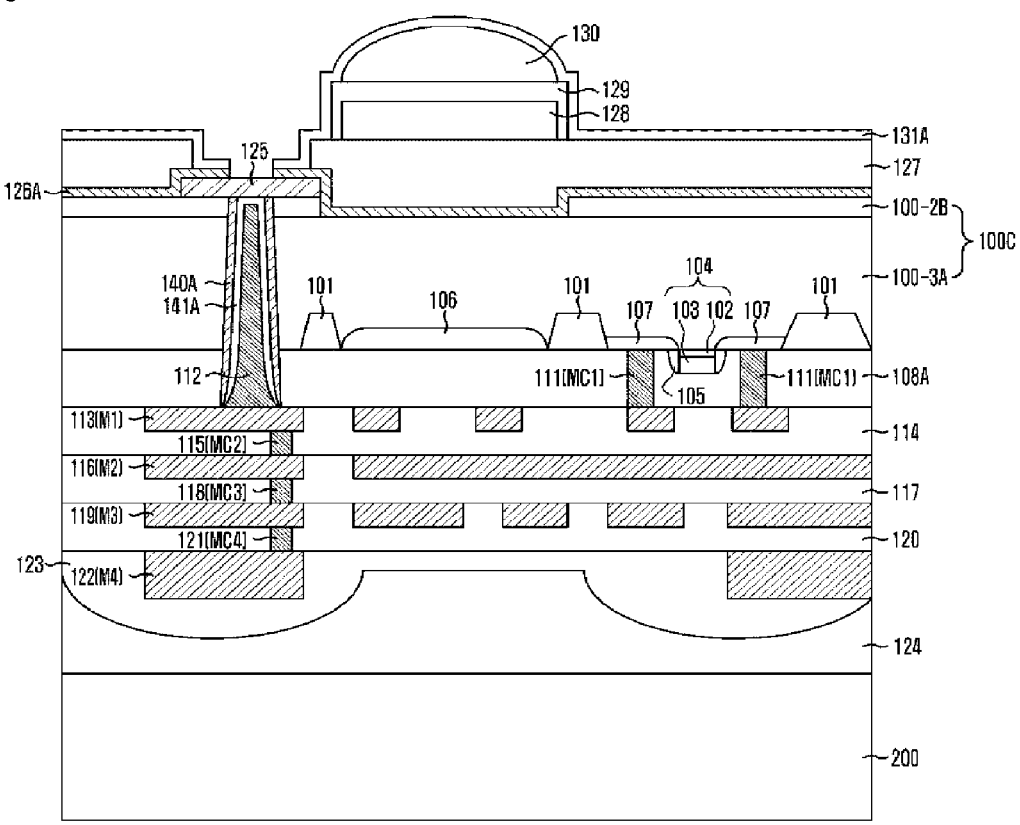

Referring to FIG. 12, the LTO layer 131A and the anti-light scattering layer 126A are locally etched so that the pad 125 is fully or partially exposed for wire bonding.

The first substrate 100C and the second substrate 200 are packaged by a packaging process. The packaging process includes a wire bonding process and a sawing process. The wire bonding process is achieved by bonding the pad 125 to an external chip through a wire.

In the embodiment of the present invention, a CMOS image sensor has been described as an example. However, the present invention can be applied to an image sensor using a backside illumination method and a three-dimensional integrated device. Although an exemplary embodiment of the present invention has been described for illustrative purposes, those skilled in the art will appreciate that various modifications, additions and substitutions are possible, without departing from the scope and spirit of the invention as disclosed in the accompanying claims.

The invention claimed is:
1. A method for manufacturing an image sensor, the method comprising:
 forming a light-receiving element in a first side of a first substrate;
 forming an interlayer insulation layer over the first side of the first substrate and the light-receiving element;

etching the interlayer insulation layer and first substrate to form a via hole through the interlayer insulation layer and the first substrate;
forming a spacer on an inner sidewall of the via hole;
forming an adhesive layer along an inner surface of the via hole;
forming a barrier layer along the inner surface of the via hole after said forming a spacer;
filling the via hole with conductive material to form an alignment key on the barrier layer;
forming interconnection layers on the interlayer insulation layer and the alignment key;
bonding a second substrate to the first side of the first substrate via the interconnection layers;
exposing the alignment key on a second side of the first substrate that is opposite the first side of the first substrate; and
forming a pad on the second side of the first substrate that is coupled to the alignment key.

2. The method of claim 1, further comprising forming both a color filter and a microlens on the second side of the first substrate, wherein the color filter and microlens are configured to direct light toward the light-receiving element.

3. A method for manufacturing an image sensor, the method comprising:
forming a light-receiving element in a first side of a first substrate;
forming an interlayer insulation layer over the first side of the first substrate and the light-receiving element;
etching the interlayer insulation layer and first substrate to form a via hole through the interlayer insulation layer and the first substrate;
forming a spacer on an inner sidewall of the via hole;
forming a barrier layer along an inner surface of the via hole after said forming a spacer;
filling the via hole with conductive material to form an alignment key on the barrier layer;
forming interconnection layers on the interlayer insulation layer and the alignment key;
bonding a second substrate to the first side of the first substrate via the interconnection layers;
exposing the alignment key on a second side of the first substrate that is opposite the first side of the first substrate; and
forming a pad on the second side of the first substrate that is coupled to the alignment key;
wherein said exposing the alignment key includes back-grinding the second side of the first substrate and etching a buried oxide layer on the second side of the first substrate to expose the alignment key.

4. The method of claim 1, wherein said forming a barrier layer comprises forming a barrier layer selected from the group consisting of Ti, TiN, Ta, TaN, AlSiTiN, NiTi, TiBN, ZrBN, TiAlN, TiB2, Ti/TiN, and Ta/TaN.

5. The method of claim 1, further comprising forming an anti-light scattering layer on the second side of the first substrate.

6. The method of claim 3, further comprising forming an adhesive layer along the inner surface of the via hole.

7. A method for manufacturing an image sensor, the method comprising:
forming a light-receiving element in a first side of a first substrate;
forming an interlayer insulation layer over the first side of the first substrate and the light-receiving element;
etching the interlayer insulation layer and first substrate to form a via hole through the interlayer insulation layer and the first substrate;
forming a spacer on an inner sidewall of the via hole;
forming a barrier layer along an inner surface of the via hole after said forming a spacer;
filling the via hole with conductive material to form an alignment key on the barrier layer;
forming interconnection layers on the interlayer insulation layer and the alignment key;
bonding a second substrate to the first side of the first substrate via the interconnection layers;
exposing the alignment key on a second side of the first substrate that is opposite the first side of the first substrate; and
forming a pad on the second side of the first substrate that is coupled to the alignment key; and
removing a region of a buried oxide layer formed on the second side of the first substrate, wherein the region corresponds to the light-receiving element.

8. The method of claim 1, further comprising forming a passivation layer over the interconnection layers prior to said bonding a second substrate to the first side of the first substrate.

9. The method of claim 6, further comprising removing a region of a buried oxide layer formed on the second side of the first substrate, wherein the region corresponds to the light-receiving element.

10. The method of claim 7, wherein said exposing the alignment keys comprises:
back-grinding the second side of the first substrate; and
etching a buried oxide layer on the second side of the first substrate to expose the alignment keys.

11. The method of claim 1, further comprising:
forming a drain region in the first side of the first substrate;
etching the interlayer insulation layer to form a contact hole through the interlayer insulation to the drain region;
forming a barrier layer along an inner surface of the contact hole; and
filling the contact hole with conductive material to form a contact plug.

12. A method for manufacturing an image sensor, the method comprising:
forming a light-receiving element in a first side of a first substrate;
forming an interlayer insulation layer over the first side of the first substrate and the light-receiving element;
etching the interlayer insulation layer and first substrate to form a plurality of via holes through the interlayer insulation layer and the first substrate;
forming a spacer on an inner sidewall of each via hole of the plurality of via holes;
forming an adhesive layer along an inner surface of each via hole of the plurality of via holes;
forming a barrier layer along the inner surface of each via hole of the plurality of via holes after said forming a spacer;
filling each via hole of the plurality of via holes with conductive material to form an alignment key on the barrier layer of each via hole;
forming interconnection layers on the interlayer insulation layer and the alignment keys;
bonding a second substrate to the first side of the first substrate via the interconnection layers;
exposing the alignment keys on a second side of the first substrate that is opposite the first side of the first substrate; and forming a pad on the second side of the first substrate that is coupled to the alignment keys.

13. The method of claim 12, further comprising forming both a color filter and a microlens on the second side of the first substrate, wherein the color filter and microlens are configured to direct light toward the light-receiving element.

14. The method of claim 12, wherein said forming a barrier layer comprises forming a barrier layer selected from the group consisting of Ti, TiN, Ta, TaN, AlSiTiN, NiTi, TiBN, ZrBN, TiAlN, TiB2, Ti/TiN, and Ta/TaN.

15. The method of claim 12, further comprising forming an anti-light scattering layer on the second side of the first substrate.

16. The method of claim 12, wherein said exposing the alignment keys comprises:
   back-grinding the second side of the first substrate; and
   etching a buried oxide layer on the second side of the first substrate to expose the alignment keys.

17. The method of claim 12, further comprising removing a region of a buried oxide layer formed on the second side of the first substrate, wherein the region corresponds to the light-receiving element.

18. The method of claim 12, further comprising forming a passivation layer over the interconnection layers prior to said bonding a second substrate to the first side of the first substrate.

19. The method of claim 12, further comprising:
   forming a plurality of drain regions in the first side of the first substrate;
   etching the interlayer insulation layer and first substrate to form a plurality of
   contact holes through the interlayer insulation to one or more of the plurality of drain regions;
   forming a barrier layer along an inner surface of each contact hole of the plurality of contact holes; and
   filling each contact hole of the plurality of contact holes with conductive material.

* * * * *